(12) United States Patent
Chua et al.

(10) Patent No.: US 9,530,738 B2
(45) Date of Patent: Dec. 27, 2016

(54) SEMICONDUCTOR DEVICE AND METHOD OF FORMING INTERCONNECT STRUCTURE AND MOUNTING SEMICONDUCTOR DIE IN RECESSED ENCAPSULANT

(71) Applicant: STATS ChipPAC, Ltd., Singapore (SG)

(72) Inventors: Linda Pei Ee Chua, Singapore (SG); Byung Tai Do, Singapore (SG); Reza A. Pagaila, Tangerang (ID)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/462,347

(22) Filed: Aug. 18, 2014

(65) Prior Publication Data

US 2014/0353846 A1 Dec. 4, 2014

Related U.S. Application Data

(63) Continuation of application No. 13/935,963, filed on Jul. 5, 2013, now Pat. No. 8,823,182, which is a
(Continued)

(51) Int. Cl.
*H01L 23/48* (2006.01)
*H01L 23/02* (2006.01)
(Continued)

(52) U.S. Cl.
CPC ......... *H01L 23/5384* (2013.01); *H01L 21/561* (2013.01); *H01L 21/568* (2013.01);
(Continued)

(58) Field of Classification Search
CPC .. H01L 21/561; H01L 23/13; H01L 23/49811;
H01L 23/5389; H01L 23/48; H01L 24/19; H01L 24/96; H01L 23/481; H01L 29/40; H01L 2224/2518; H01L 23/5384; H01L 21/568; H01L 21/76885; H01L 23/52; H01L 23/552; H01L 24/82; H01L 24/97; H01L 25/03; H01L 25/0657; H01L 25/50
(Continued)

(56) References Cited

U.S. PATENT DOCUMENTS 5,250,843 A 10/1993 Eichelberger
5,353,498 A 10/1994 Fillion et al.
(Continued)

FOREIGN PATENT DOCUMENTS

JP 08-070094 12/1996

*Primary Examiner* — Dzung Tran
(74) *Attorney, Agent, or Firm* — Robert D. Atkins; Patent Law Group: Atkins and Associates, P.C.

(57) ABSTRACT

A semiconductor device has conductive pillars formed over a carrier. A first semiconductor die is mounted over the carrier between the conductive pillars. An encapsulant is deposited over the first semiconductor die and carrier and around the conductive pillars. A recess is formed in a first surface of the encapsulant over the first semiconductor die. The recess has sloped or stepped sides. A first interconnect structure is formed over the first surface of the encapsulant. The first interconnect structure follows a contour of the recess in the encapsulant. The carrier is removed. A second interconnect structure is formed over a second surface of the encapsulant and first semiconductor die. The first and second interconnect structures are electrically connected to the conductive pillars. A second semiconductor die is mounted in the recess. A third semiconductor die is mounted over the recess and second semiconductor die.

25 Claims, 15 Drawing Sheets

Related U.S. Application Data continuation of application No. 12/780,268, filed on May 14, 2010, now Pat. No. 8,558,392.

(51) Int. Cl.

| | | |
|---|---|---|
| *H01L 23/52* | (2006.01) | |
| *H01L 29/40* | (2006.01) | |
| *H01L 23/538* | (2006.01) | |
| *H01L 21/56* | (2006.01) | |
| *H01L 23/13* | (2006.01) | |
| *H01L 23/498* | (2006.01) | |
| *H01L 23/00* | (2006.01) | |
| *H01L 25/03* | (2006.01) | |
| *H01L 25/00* | (2006.01) | |
| *H01L 23/552* | (2006.01) | |
| *H01L 21/768* | (2006.01) | |
| *H01L 25/065* | (2006.01) | |
| *H01L 23/31* | (2006.01) | |

(52) U.S. Cl.
CPC ........ *H01L 21/76885* (2013.01); *H01L 23/13* (2013.01); *H01L 23/48* (2013.01); *H01L 23/49811* (2013.01); *H01L 23/52* (2013.01); *H01L 23/5389* (2013.01); *H01L 23/552* (2013.01); *H01L 24/19* (2013.01); *H01L 24/82* (2013.01); *H01L 24/96* (2013.01); *H01L 24/97* (2013.01); *H01L 25/03* (2013.01); *H01L 25/0657* (2013.01); *H01L 25/50* (2013.01); *H01L 29/40* (2013.01); *H01L 23/3128* (2013.01); *H01L 23/481* (2013.01); *H01L 23/49816* (2013.01); *H01L 2224/0401* (2013.01); *H01L 2224/04105* (2013.01); *H01L 2224/12105* (2013.01); *H01L 2224/16145* (2013.01); *H01L 2224/16225* (2013.01); *H01L 2224/20* (2013.01); *H01L 2224/2518* (2013.01); *H01L 2224/32145* (2013.01); *H01L 2224/73253* (2013.01); *H01L 2224/73259* (2013.01); *H01L 2224/97* (2013.01); *H01L 2225/1035* (2013.01); *H01L 2225/1041* (2013.01); *H01L 2225/1058* (2013.01); *H01L 2225/1088* (2013.01); *H01L 2924/014* (2013.01); *H01L 2924/01004* (2013.01); *H01L 2924/01013* (2013.01); *H01L 2924/01029* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/15311* (2013.01); *H01L 2924/181* (2013.01); *H01L 2924/1815* (2013.01)

(58) Field of Classification Search
USPC ........ 257/686, 690, 774, 778, E23.001, 777; 438/106
See application file for complete search history.

(56) References Cited

U.S. PATENT DOCUMENTS

| | | | |
|---|---|---|---|
| 5,841,193 | A | 11/1998 | Eichelberger |
| 6,064,114 | A | 5/2000 | Higgins, III |
| 7,619,901 | B2 | 11/2009 | Eichelberger et al. |
| 7,633,765 | B1 | 12/2009 | Scanlan et al. |
| 7,863,735 | B1 | 1/2011 | Cho et al. |
| 7,928,552 | B1 | 4/2011 | Cho et al. |
| 2005/0275081 | A1 | 12/2005 | Chang |
| 2007/0069371 | A1 | 3/2007 | Iksan et al. |
| 2008/0315375 | A1 | 12/2008 | Eichelberger et al. |
| 2008/0316714 | A1 | 12/2008 | Eichelberger et al. |
| 2009/0218678 | A1* | 9/2009 | Kawabata et al. ............ 257/698 |
| 2009/0224391 | A1 | 9/2009 | Lin et al. |
| 2009/0278244 | A1 | 11/2009 | Dunne et al. |
| 2010/0025833 | A1 | 2/2010 | Pagaila et al. |
| 2010/0072606 | A1* | 3/2010 | Yang .............................. 257/692 |
| 2010/0102456 | A1* | 4/2010 | Pagaila et al. ................. 257/774 |
| 2010/0237492 | A1* | 9/2010 | Sasaki et al. .................. 257/692 |
| 2013/0027896 | A1* | 1/2013 | Lee et al. ...................... 361/761 |
| 2013/0270682 | A1* | 10/2013 | Hu et al. ....................... 257/666 |

\* cited by examiner

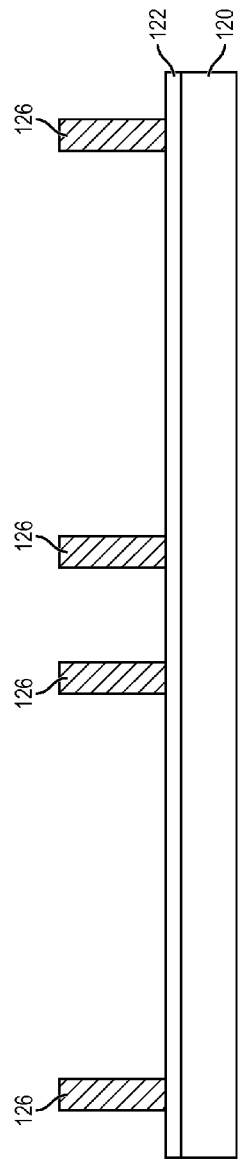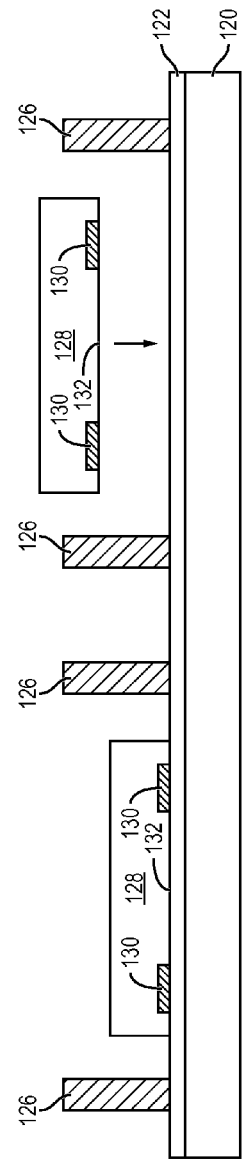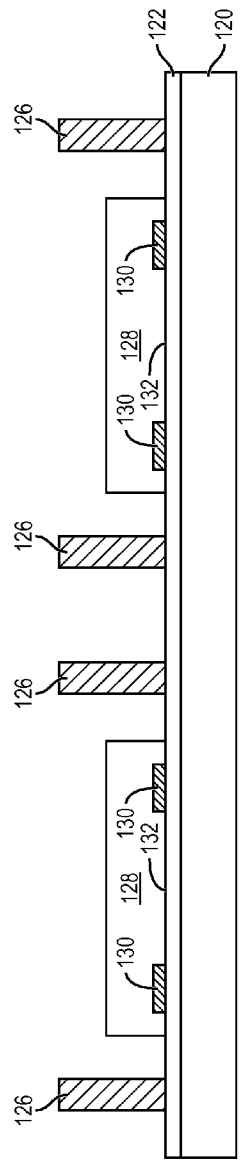

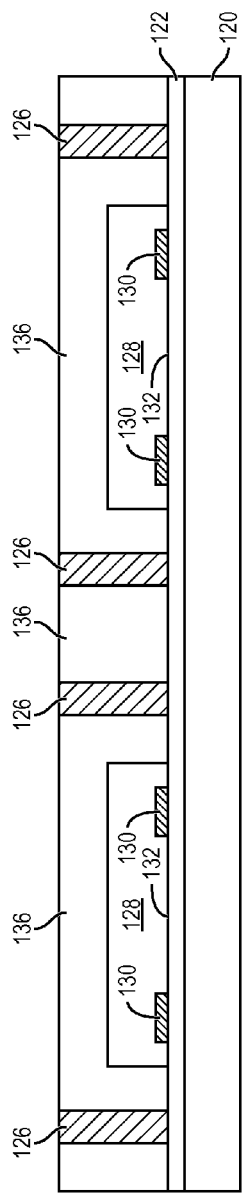
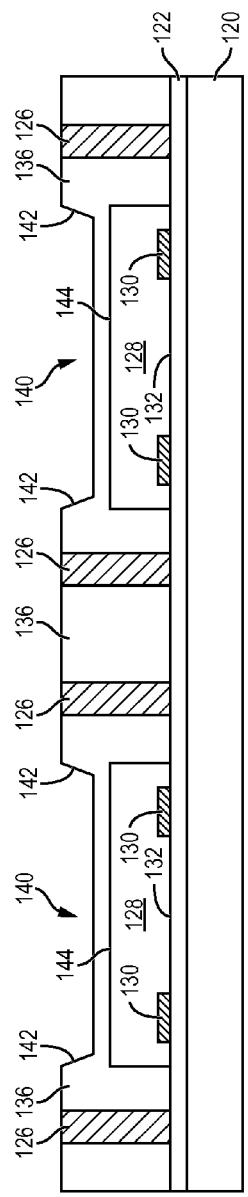
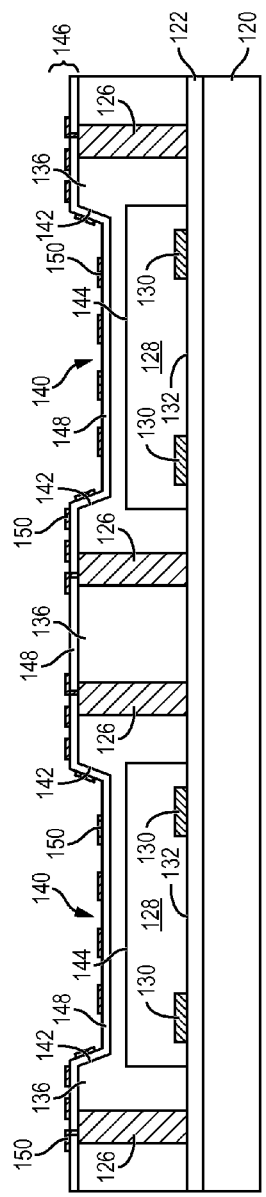
FIG. 3g
FIG. 3h
FIG. 3i

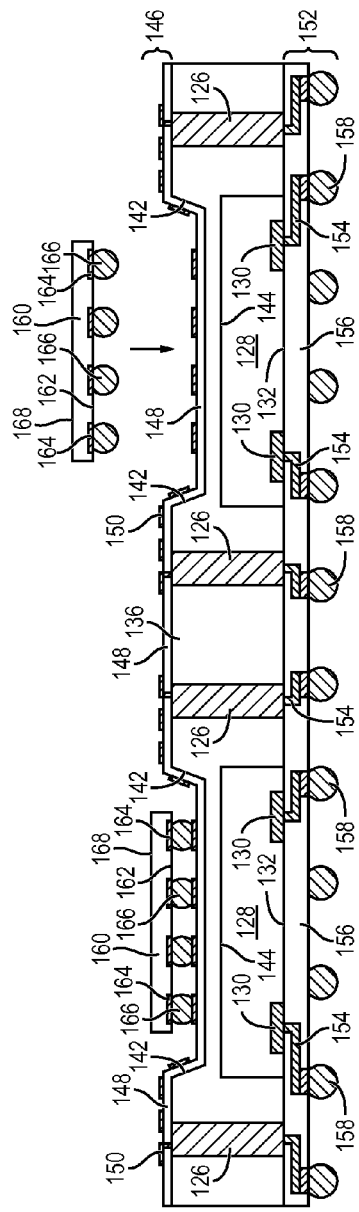

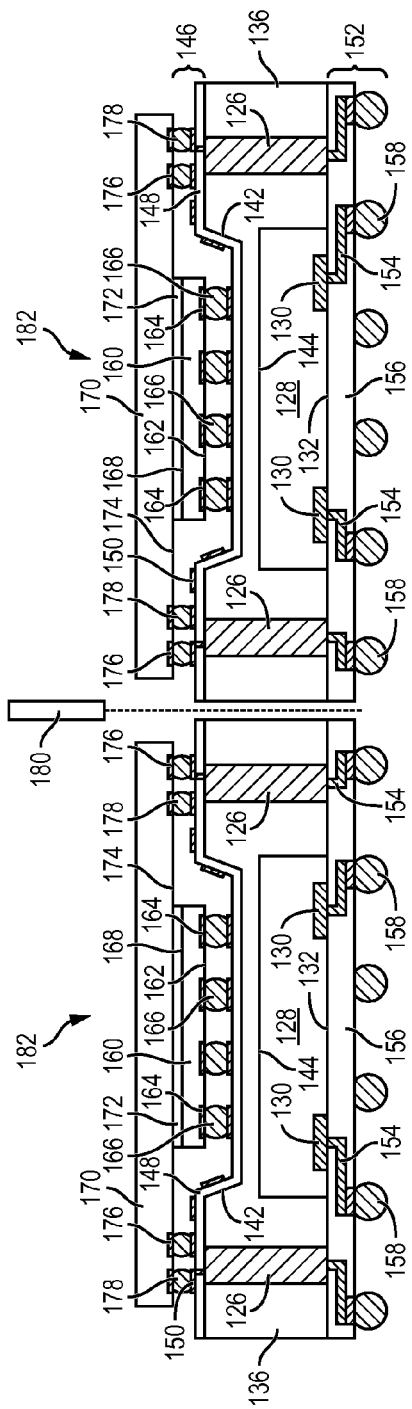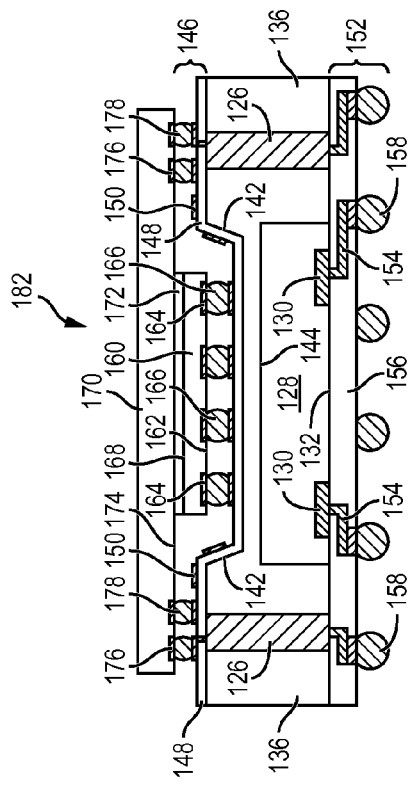

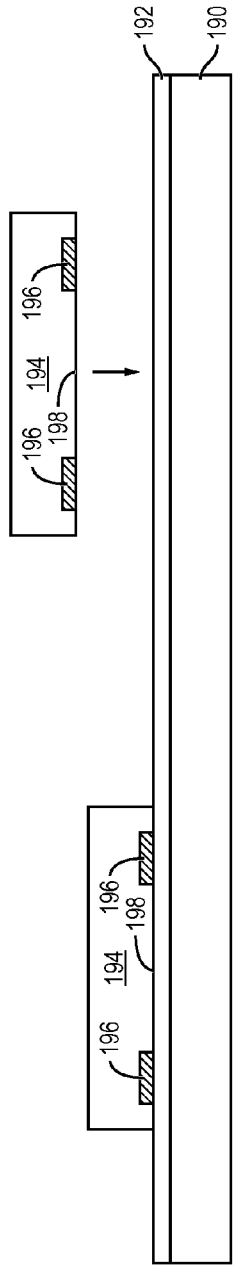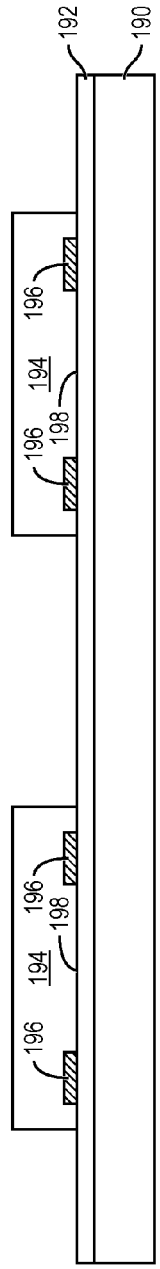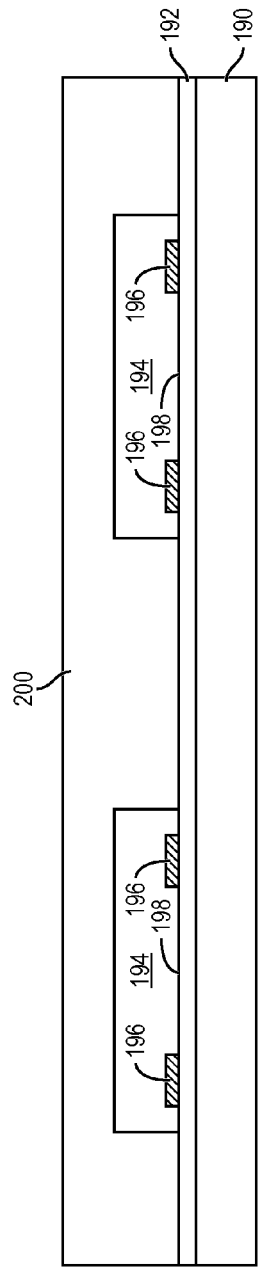

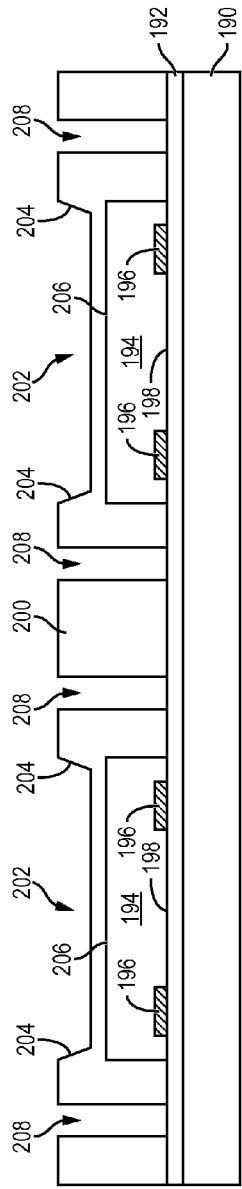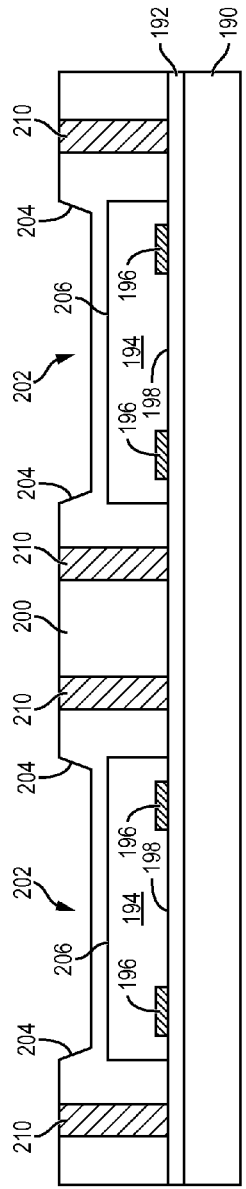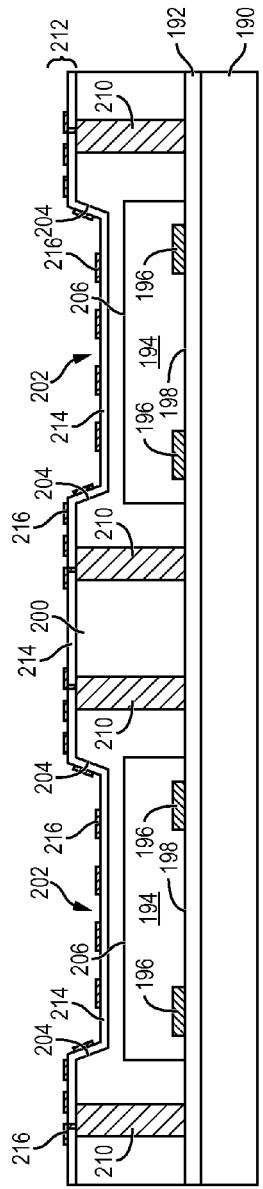

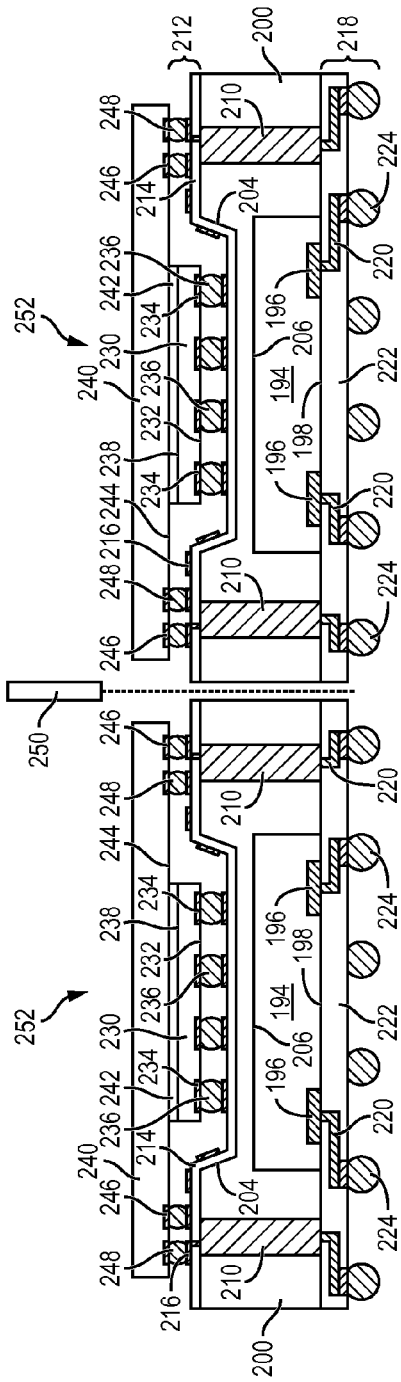
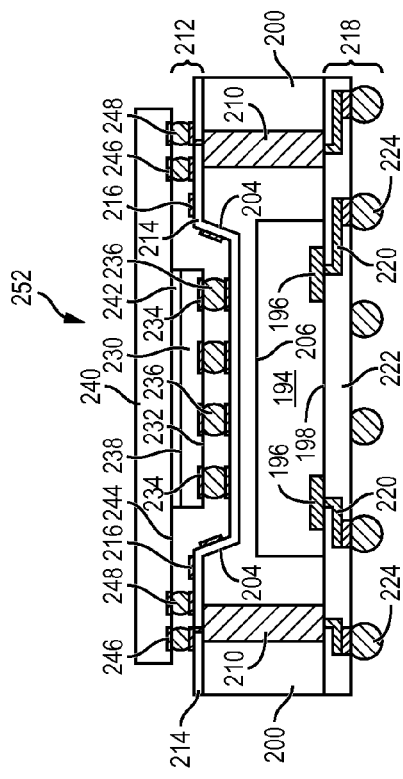
FIG. 5l
FIG. 6

SEMICONDUCTOR DEVICE AND METHOD OF FORMING INTERCONNECT STRUCTURE AND MOUNTING SEMICONDUCTOR DIE IN RECESSED ENCAPSULANT

CLAIM TO DOMESTIC PRIORITY

The present application is a continuation of U.S. patent application Ser. No. 13/935,963, now U.S. Pat. No. 8,823, 182, filed Jul. 5, 2013, which is a continuation of U.S. patent application Ser. No. 12/780,268, now U.S. Pat. No. 8,558, 392, filed May 14, 2010, which applications are incorporated herein by reference.

FIELD OF THE INVENTION

The present invention relates in general to semiconductor devices and, more particularly, to a semiconductor device and method of forming an interconnect structure and mounting a semiconductor die in recessed encapsulant.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection in a fan-out wafer level chip scale package (FO-WLCSP) containing semiconductor die stacked on multiple levels can be accomplished with conductive through silicon vias (TSV), through hole vias (THV), and Cu-plated conductive pillars. Vias are formed in silicon or organic material around the die using laser drilling or deep reactive ion etching (DRIE). The vias are filled with conductive material, for example by copper deposition using an electroplating process, to form the conductive TSVs and THVs. The TSVs and THVs further connect through build-up interconnect structures which are formed across each semiconductor die. An encapsulant is deposited over the stacked semiconductor die.

Bumps are typically formed on the semiconductor die and interconnect structure for electrical interconnect. The bumps are sized according to the spacing between the stacked semiconductor die and interconnect structure. If the spacing is large, the bumps are correspondingly large as well. Bumps with a large diameter reduce pitch between the bumps, input/output (I/O) count, and interconnect density. In addition, large bumps are susceptible to bump collapse, which can cause electrical shorts between adjacent bumps.

SUMMARY OF THE INVENTION

A need exists to reduce the height of stacked semiconductor die in FO-WLCSP in order to reduce the size of the bumps for reduced bump pitch and greater I/O count and interconnect density. Accordingly, in one embodiment, the present invention is a method of making a semiconductor device comprising the steps of providing a first semiconductor die, providing a first interconnect structure, depositing an encapsulant over the first semiconductor die, and forming a second interconnect structure over the first semiconductor die, encapsulant, and first interconnect structure.

In another embodiment, the present invention is a method of making a semiconductor device comprising the steps of providing a first semiconductor die, providing a first interconnect structure, and depositing an encapsulant over the first semiconductor die with the first interconnect structure extending through the encapsulant.

In another embodiment, the present invention is a semiconductor device comprising a first semiconductor die. A first interconnect structure is disposed adjacent to the first semiconductor die. An encapsulant is deposited over the first semiconductor die. A second interconnect structure is disposed over the first semiconductor die.

In another embodiment, the present invention is a semiconductor device comprising a first semiconductor die. A first interconnect structure is disposed adjacent to the first semiconductor die. An encapsulant is deposited over the first semiconductor die.

BRIEF DESCRIPTION OF THE DRAWINGS

FIG. 4 illustrates a FO-WLCSP with the interconnect structure and semiconductor die in recessed encapsulant;

FIGS. 5a-5l illustrate another embodiment of forming an interconnect structure and mounting a semiconductor die in recessed encapsulant;

FIG. 6 illustrates a FO-WLCSP with the interconnect structure and semiconductor die in recessed encapsulant;

DETAILED DESCRIPTION OF THE DRAWINGS

Figure 1:
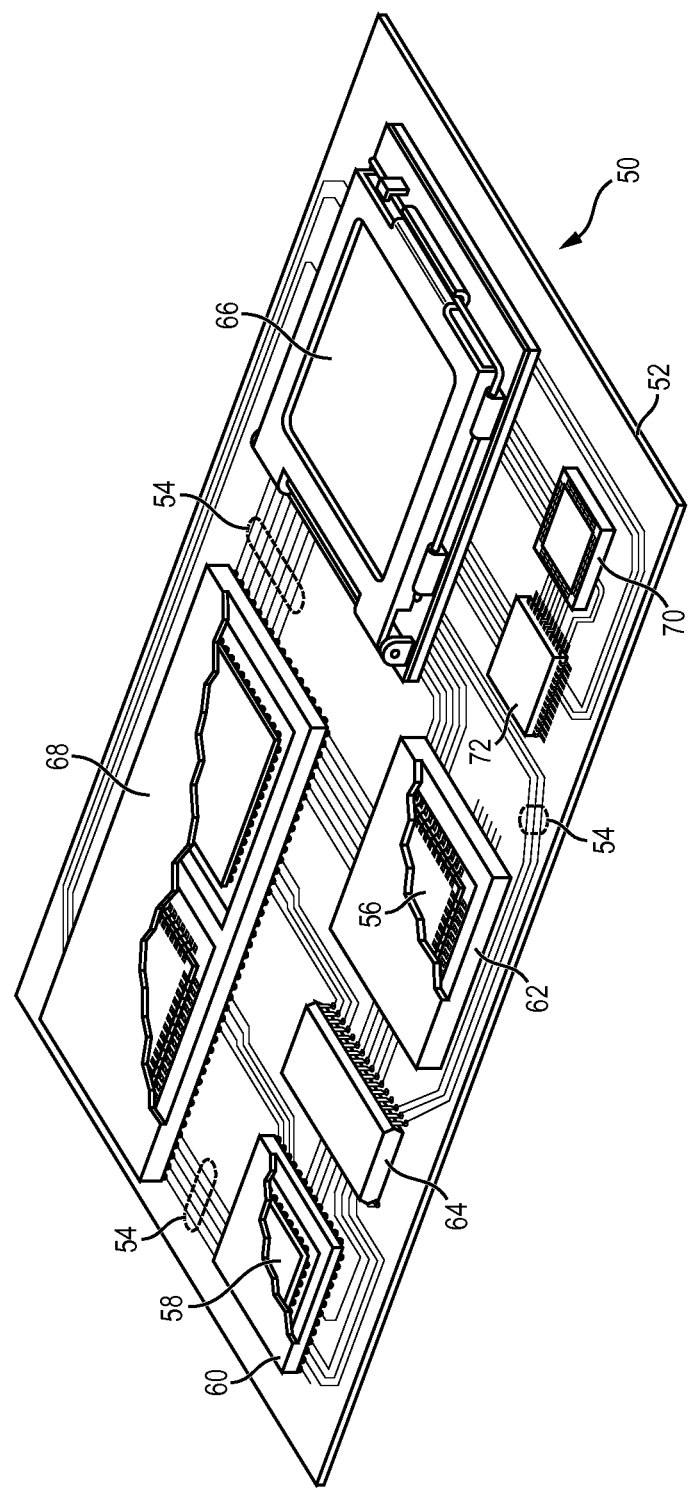
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
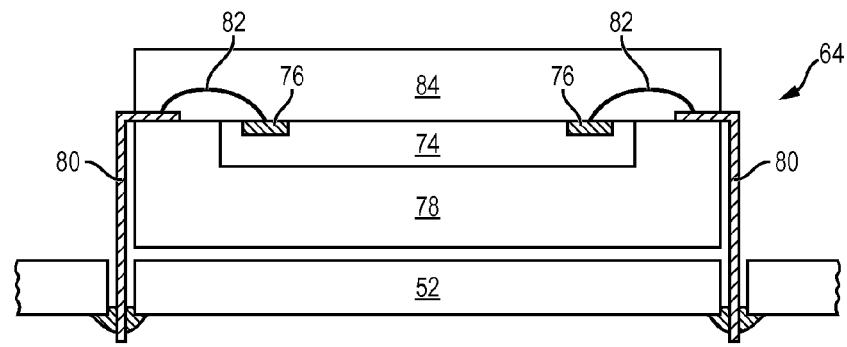
FIGS. 2a-2c illustrate further detail of the representative semiconductor packages mounted to the PCB.
Figure 2B:
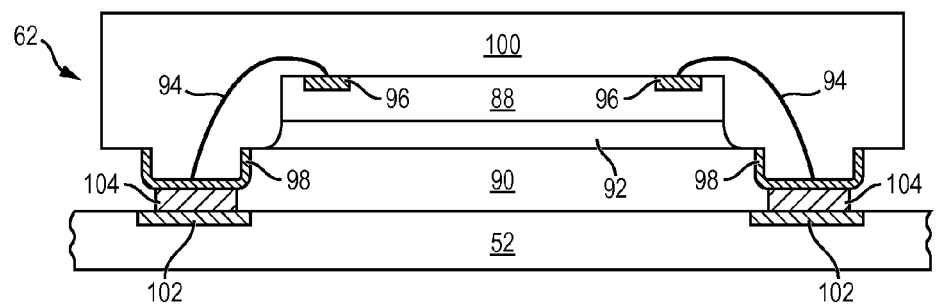
Figure 2C:
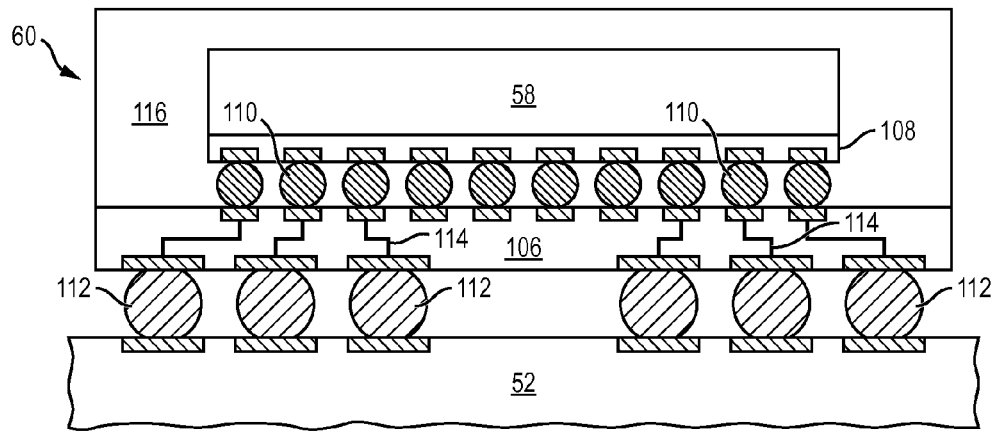

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
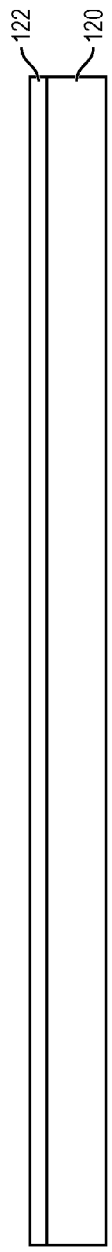
FIGS. 3a-3o illustrate a process of forming an interconnect structure and mounting a semiconductor die in recessed encapsulant.

FIGS. 3a-3o illustrate, in relation to FIGS. 1 and 2a-2c, a process of forming an interconnect structure and mounting a semiconductor die in recessed encapsulant to reduce bump size. In FIG. 3a, a temporary substrate or carrier 120 contains sacrificial base material such as silicon, polymer, polymer composite, metal, ceramic, glass, glass epoxy, beryllium oxide, or other suitable low-cost, rigid material or bulk semiconductor material for structural support. Carrier 120 can also be tape. An optional interface layer 122 can be formed over carrier 120 as a temporary adhesive bonding film or etch-stop layer.

Figure 3B:
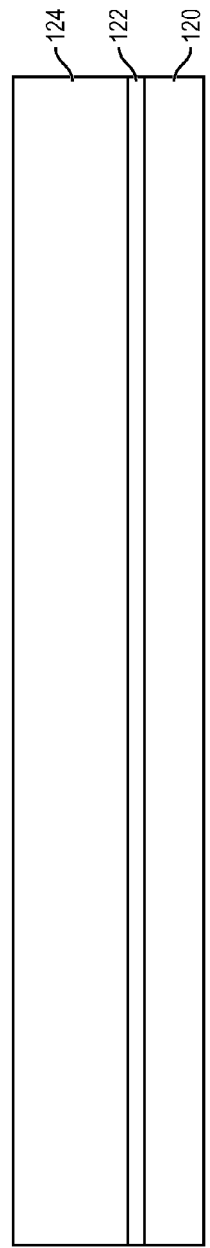
Figure 3C:
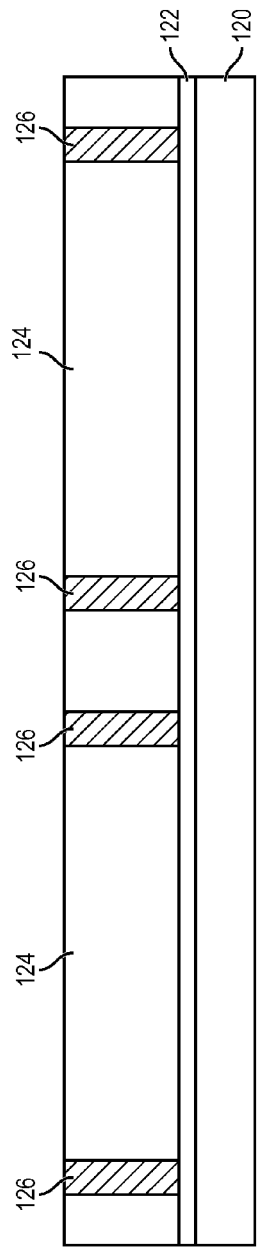

In FIG. 3b, a thick layer of insulating material or photoresist 124 is deposited over interface layer 122. The photoresist can be a liquid or a dry film with a thickness of 30 to 125 micrometers (μm). Two layers of photoresist may be applied to achieve the desired thickness. Photoresist 124 is patterned using photolithography and etched to form a plurality of vias. A conductive material, such as Al, Cu, Sn, Ni, Au, Ag, Ti, tungsten (W), or poly-silicon, is deposited into the vias using electrolytic plating, electroless plating, or other suitable metal deposition process to form conductive pillars or vias 126, as shown in FIG. 3c. In FIG. 3d, photoresist 124 is stripped away leaving behind individual conductive pillars or vias 126 over carrier 120. In one embodiment, conductive pillars 126 have a height of 20-120 μm. Alternatively, a plurality of stud bumps or solder balls can be formed within the vias.

In FIG. 3e, semiconductor die or components 128 are mounted to interface layer 122 between conductive pillars 126 with contact pads 130 formed over active surface 132 oriented downward toward carrier 120. Active surface 132 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 132 to implement analog circuits or digital circuits, such as digital signal processing (DSP), ASIC, memory, or other signal processing circuit. Semiconductor die 128 may also contain IPDs, such as inductors, capacitors, and resistors, for RF signal processing. In one embodiment, semiconductor die 128 is a flipchip type semiconductor die. FIG. 3f shows all semiconductor die 128 mounted to carrier 120 between conductive pillars 126.

In FIG. 3g, an encapsulant or molding compound 136 is deposited over carrier 120 and semiconductor die 128 and around conductive pillars 126 using a paste printing, compressive molding, transfer molding, liquid encapsulant molding, vacuum lamination, spin coating, or other suitable applicator. Encapsulant 136 can be polymer composite material, such as epoxy resin with filler, epoxy acrylate with filler, or polymer with proper filler. Encapsulant 136 is non-conductive and environmentally protects the semiconductor device from external elements and contaminants.

In FIG. 3h, a portion of encapsulant 136 over semiconductor die 128 is removed by an etching process to form recesses 140 having stepped or sloped sides 142. Semiconductor die or components are mounted within recesses 140 between stepped or sloped sides 142 in a subsequent process. Encapsulant 136 remains covering back surface 144 of semiconductor die 128, opposite active surface 132. Alternatively, recesses 140 can be formed simultaneously with encapsulant 136 by using a dedicated mold chase with integrated recess.

In FIG. 3i, an interconnect structure 146 is formed over encapsulant 136, including along the contour of recesses 140 and stepped or sloped sides 142. The interconnect structure 146 includes an insulating or passivation layer 148 containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 148 is formed using PVD, CVD, printing, spin coating, spray coating, sintering or thermal oxidation. The insulating layer 148 follows the contour of encapsulant 136, including recesses 140 and stepped or sloped sides 142.

The interconnect structure 146 further includes an electrically conductive layer 150 formed over insulating layer 148 using a patterning and metal deposition process such as PVD, CVD, sputtering, electrolytic plating, and electroless plating. Conductive layer 150 can be one or more layers of Al, Cu, Sn, Ni, Au, Ag, or other suitable electrically conductive material. Conductive layer 150 also follows the contour of encapsulant 136, including recess 140 and stepped or sloped sides 142. One portion of conductive layer 150 is electrically connected to conductive pillars 126. Other portions of conductive layer 150 can be electrically common or electrically isolated depending on the design and function of the semiconductor device.

Figure 3J:
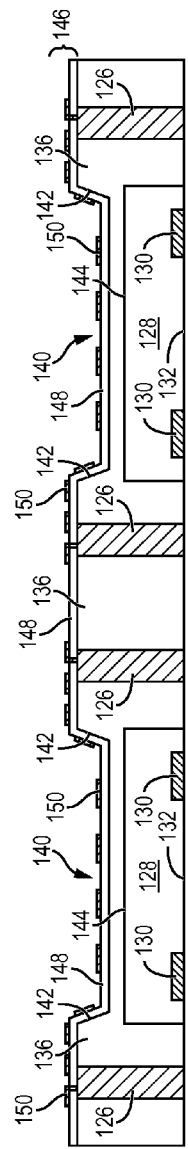

In FIG. 3j, temporary carrier 120 and interface layer 122 are removed by chemical etching, mechanical peel-off, CMP, mechanical grinding, thermal bake, UV light, laser scanning, or wet stripping to expose encapsulant 136 and semiconductor die 128.

Figure 3K:
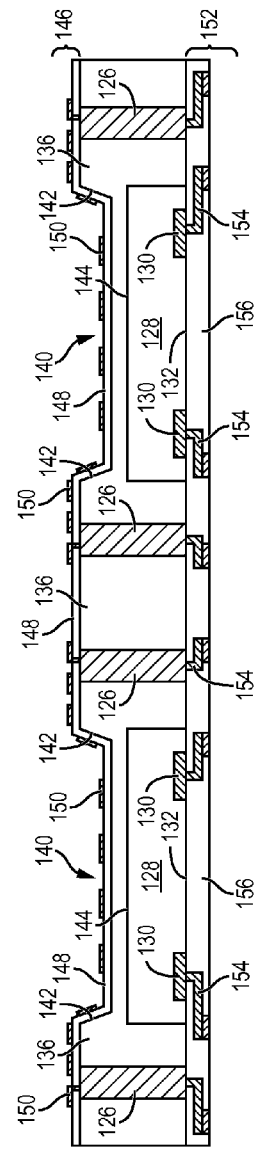

In FIG. 3k, a bottom-side build-up interconnect structure 152 is formed over active surface 132 of semiconductor die 128 and encapsulant 136. The build-up interconnect structure 152 includes an electrically conductive layer or redistribution layer (RDL) 154 formed using a patterning and metal deposition process such as sputtering, electrolytic plating, and electroless plating. Conductive layer 154 can be one or more layers of Al, Cu, Sn, Ni, Au, Ag, or other suitable electrically conductive material. One portion of conductive layer 154 is electrically connected to contact pads 130 of semiconductor die 128. Another portion of conductive layer 154 is electrically connected to conductive pillars 126. Other portions of conductive layer 154 can be electrically common or electrically isolated depending on the design and function of the semiconductor device.

The build-up interconnect structure 152 further includes an insulating or passivation layer 156 formed between conductive layers 154 and containing one or more layers of SiO2, Si3N4, SiON, Ta2O5, Al2O3, or other material having similar insulating and structural properties. The insulating layer 156 is formed using PVD, CVD, printing, spin coating, spray coating, sintering or thermal oxidation.

Figure 3L:
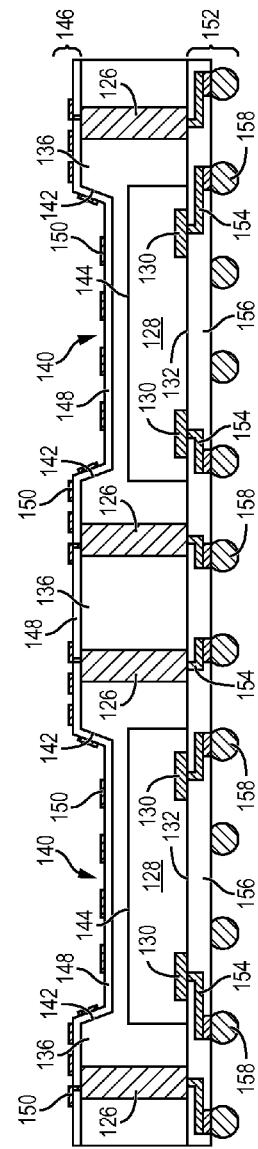

In FIG. 3l, an electrically conductive bump material is deposited over build-up interconnect structure 152 and electrically connected to conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 158. In some applications, bumps 158 are reflowed a second time to improve electrical contact to conductive layer 154. The bumps can also be compression bonded to conductive layer 154. Bumps 158 represent one type of interconnect structure that can be formed over conductive layer 154. The interconnect structure can also use bond wires, stud bump, micro bump, or other electrical interconnect.

In FIG. 3m, semiconductor die or components 160 have an active surface 162 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 162 to implement analog circuits or digital circuits, such as DSP, ASIC, memory, or other signal processing circuit. Semiconductor die 160 may also contain IPDs, such as inductors, capacitors, and resistors, for RF signal processing. In one embodiment, semiconductor die 160 is a flipchip type semiconductor die. A plurality of contact pads 164 is formed over active surface 162 and electrically connected to circuits in the active surface. A plurality of bumps 166 is formed over contact pads 164. Semiconductor die 160 are mounted to interconnect structure 146 within recess 140 between stepped or sloped sides 142. Bumps 166 are electrically connected to conductive layer 150. A discrete passive or active circuit can also be mounted within recess 140 and electrically connected to conductive layer 150.

In FIG. 3n, semiconductor die or components 170 have an active surface 174 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 174 to implement analog circuits or digital circuits, such as DSP, ASIC, memory, or other signal processing circuit. Semiconductor die 170 may also contain IPDs, such as inductors, capacitors, and resistors, for RF signal processing. In one embodiment, semiconductor die 170 is a flipchip type semiconductor die. A plurality of contact pads 176 is formed over active surface 174 and electrically connected to circuits in the active surface. A plurality of bumps 178 is formed over contact pads 176. Bumps 178 have reduced height and pitch for greater I/O count and interconnect density due to semiconductor die 160 being mounted in recess 140. Semiconductor die 170 are mounted over recess 140 to back surface 168 of semiconductor die 160 with interposing insulating layer 172. Bumps 178 are electrically connected to conductive layer 150. A discrete passive or active circuit can also be mounted to back surface 168 of semiconductor die 160 and electrically connected to conductive layer 150.

In FIG. 3o, semiconductor die 128, 160, and 170 are singulated with saw blade or laser cutting tool 180 into individual FO-WLCSP 182.

In another embodiment, the singulation of semiconductor die 128 may occur prior to mounting semiconductor die 160 and 170, i.e. the structure shown in FIG. 3l can be singulated. In this case, semiconductor die 160 and 170 are mounted after singulation, similar to FIGS. 3m-3n.

FIG. 4 shows FO-WLCSP 182 after singulation. Semiconductor die 128 is electrically connected to interconnect structure 146, conductive pillars 126, interconnect structure 152, and bumps 158. Semiconductor die 160 is mounted within recess 140 between stepped or sloped sides 142 and electrically connected to interconnect structure 146, conductive pillars 126, interconnect structure 152, and bumps 158. Semiconductor die 170 is mounted over recess 140 and over semiconductor die 160 and electrically connected to interconnect structure 146, conductive pillars 126, interconnect structure 152, and bumps 158. FO-WLCSP 182 has a higher level of integration and reduced height with semiconductor die 160 mounted within recess 140 and interconnect structure 140 following the contour of the recess. Bumps 178 have smaller diameter and finer pitch with semiconductor die 160 mounted within recess 140, which increases I/O count. The smaller bumps 178 reduce risk of bump collapse.

In another embodiment, FIG. 5a shows a temporary substrate or carrier 190 containing sacrificial base material such as silicon, polymer, polymer composite, metal, ceramic, glass, glass epoxy, beryllium oxide, or other suitable low-cost, rigid material or bulk semiconductor material for structural support. Carrier 190 can also be tape. An optional interface layer 192 can be formed over carrier 190 as a temporary adhesive bonding film or etch-stop layer.

Semiconductor die or components 194 are mounted to interface layer 192 with contact pads 196 formed over active surface 198 oriented downward toward carrier 190. Active surface 198 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 198 to implement analog circuits or digital circuits, such as DSP, ASIC, memory, or other signal processing circuit. Semiconductor die 194 may also contain IPDs, such as inductors, capacitors, and resistors, for RF signal processing. In one embodiment, semiconductor die 194 is a flipchip type semiconductor die. FIG. 5b shows all semiconductor die 194 mounted to carrier 190.

In FIG. 5c, an encapsulant or molding compound 200 is deposited over carrier 190 and semiconductor die 194 using a paste printing, compressive molding, transfer molding, liquid encapsulant molding, vacuum lamination, spin coating, or other suitable applicator. Encapsulant 200 can be polymer composite material, such as epoxy resin with filler, epoxy acrylate with filler, or polymer with proper filler. Encapsulant 200 is non-conductive and environmentally protects the semiconductor device from external elements and contaminants.

In FIG. 5d, a portion of encapsulant 200 over semiconductor die 194 is removed by an etching process to form recesses 202 having stepped or sloped sides 204. Semiconductor die or components are mounted within recesses 202 between stepped or sloped sides 202 in a subsequent process. Encapsulant 200 remains covering back surface 206 of semiconductor die 194, opposite active surface 198. Alternatively, recesses 202 can be formed simultaneously with encapsulant 200 by using a dedicated mold chase with integrated recess. A plurality of vias 208 is formed in encapsulant 200 around semiconductor die 194 using mechanical drilling, laser drilling, or DRIE.

In FIG. 5e, vias 208 are filled with Al, Cu, Sn, Ni, Au, Ag, Ti, W, poly-silicon, or other suitable electrically conductive material using electrolytic plating, electroless plating process, or other suitable metal deposition process to form conductive pillars or vias 210. Alternatively, a plurality of stud bumps or solder balls can be formed within vias 208.

In FIG. 5f, an interconnect structure 212 is formed over encapsulant 200, including along the contour of recesses 202 and stepped or sloped sides 204. The interconnect structure 212 includes an insulating or passivation layer 214 containing one or more layers of SiO2, Si3N4, SiON, Ta2O5, Al2O3, or other material having similar insulating and structural properties. The insulating layer 214 is formed using PVD, CVD, printing, spin coating, spray coating, sintering or thermal oxidation. The insulating layer 214 follows the contour of encapsulant 200, including recesses 202 and stepped or sloped sides 204.

The interconnect structure 212 further includes an electrically conductive layer 216 formed over insulating layer 214 using a patterning and metal deposition process such as PVD, CVD, sputtering, electrolytic plating, and electroless plating. Conductive layer 216 can be one or more layers of Al, Cu, Sn, Ni, Au, Ag, or other suitable electrically conductive material. Conductive layer 216 also follows the contour of encapsulant 200, including recess 202 and stepped or sloped sides 204. One portion of conductive layer 216 is electrically connected to conductive vias 210. Other portions of conductive layer 216 can be electrically common or electrically isolated depending on the design and function of the semiconductor device.

Figure 5G:
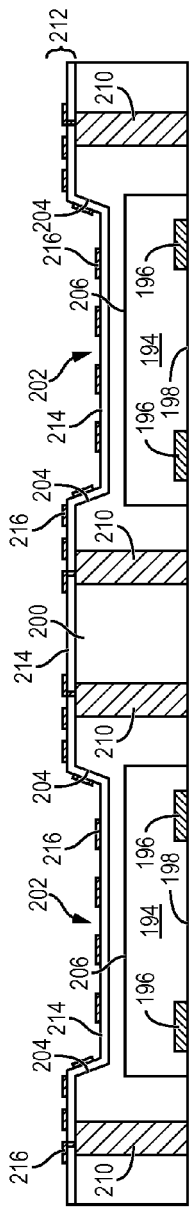

In FIG. 5g, temporary carrier 190 and interface layer 192 are removed by chemical etching, mechanical peel-off, CMP, mechanical grinding, thermal bake, UV light, laser scanning, or wet stripping to expose encapsulant 200, semiconductor die 194, and conductive vias 210.

Figure 5H:
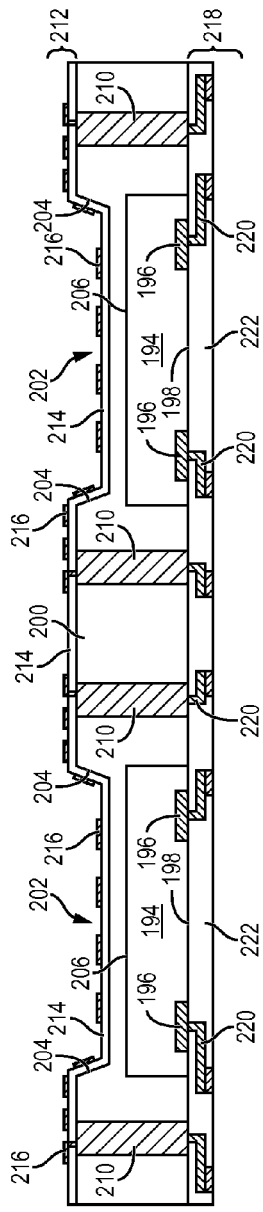

In FIG. 5h, a bottom-side build-up interconnect structure 218 is formed over active surface 198 of semiconductor die 194 and encapsulant 200. The build-up interconnect structure 218 includes an electrically conductive layer or RDL 220 formed using a patterning and metal deposition process such as sputtering, electrolytic plating, and electroless plating. Conductive layer 220 can be one or more layers of Al, Cu, Sn, Ni, Au, Ag, or other suitable electrically conductive material. One portion of conductive layer 220 is electrically connected to contact pads 196 of semiconductor die 194. Another portion of conductive layer 220 is electrically connected to conductive vias 210. Other portions of conductive layer 220 can be electrically common or electrically isolated depending on the design and function of the semiconductor device.

The build-up interconnect structure 218 further includes an insulating or passivation layer 222 formed between conductive layers 220 and containing one or more layers of SiO2, Si3N4, SiON, Ta2O5, Al2O3, or other material having similar insulating and structural properties. The insulating layer 222 is formed using PVD, CVD, printing, spin coating, spray coating, sintering or thermal oxidation.

Figure 5I:
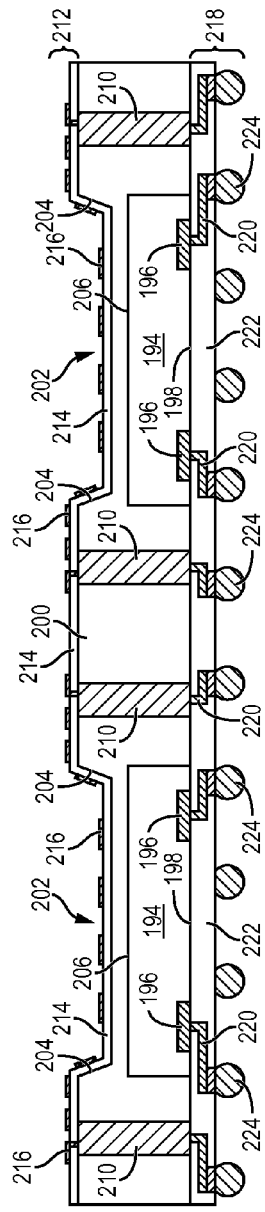

In FIG. 5i, an electrically conductive bump material is deposited over build-up interconnect structure 218 and electrically connected to conductive layer 220 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 220 using a suitable attachment or bonding process. In one embodiment, the bump material is reflowed by heating the material above its melting point to form spherical balls or bumps 224. In some applications, bumps 224 are reflowed a second time to improve electrical contact to conductive layer 220. The bumps can also be compression bonded to conductive layer 220. Bumps 224 represent one type of interconnect structure that can be formed over conductive layer 220. The interconnect structure can also use bond wires, stud bump, micro bump, or other electrical interconnect.

Figure 5J:
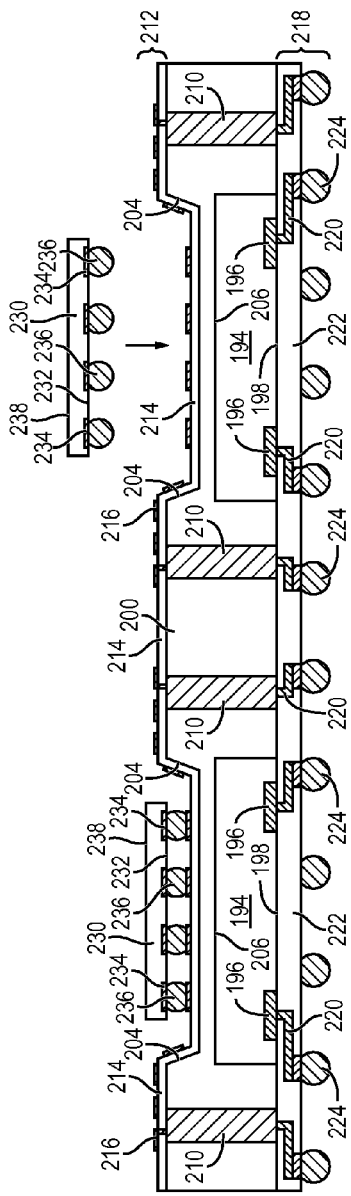

In FIG. 5j, semiconductor die or components 230 have an active surface 232 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 232 to implement analog circuits or digital circuits, such as DSP, ASIC, memory, or other signal processing circuit. Semiconductor die 230 may also contain IPDs, such as inductors, capacitors, and resistors, for RF signal processing. In one embodiment, semiconductor die 230 is a flipchip type semiconductor die. A plurality of contact pads 234 is formed over active surface 232 and electrically connected to circuits in the active surface. A plurality of bumps 236 is formed over contact pads 234. Semiconductor die 230 are mounted to interconnect structure 212 within recesses 202 between stepped or sloped sides 204. Bumps 236 are electrically connected to conductive layer 216. A discrete passive or active circuit can also be mounted within recess 202 and electrically connected to conductive layer 216.

Figure 5K:
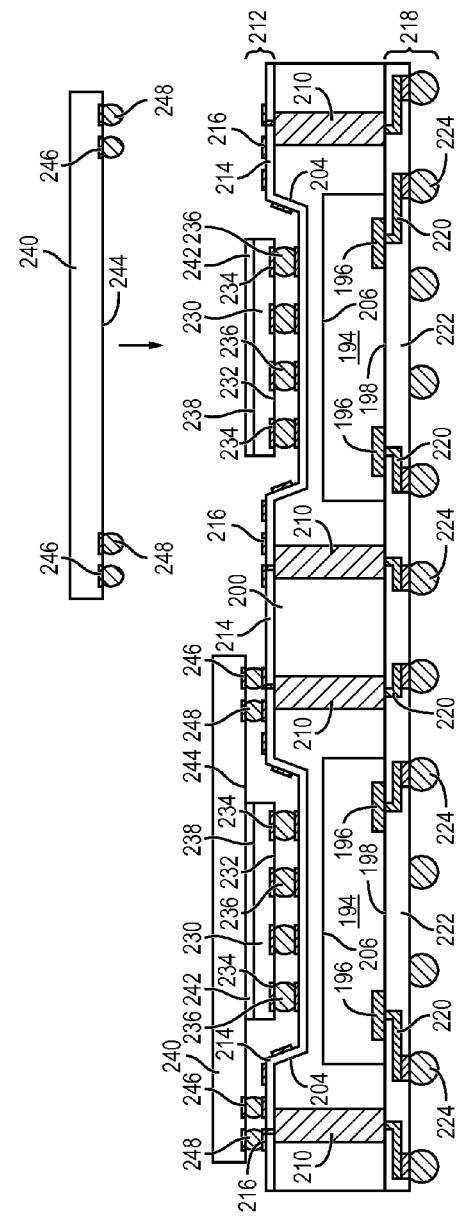

In FIG. 5k, semiconductor die or components 240 have an active surface 244 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 244 to implement analog circuits or digital circuits, such as DSP, ASIC, memory, or other signal processing circuit. Semiconductor die 240 may also contain IPDs, such as inductors, capacitors, and resistors, for RF signal processing. In one embodiment, semiconductor die 240 is a flipchip type semiconductor die. A plurality of contact pads 246 is formed over active surface 244 and electrically connected to circuits in the active surface. A plurality of bumps 248 is formed over contact pads 246. Bumps 248 have reduced height and pitch for greater I/O count and interconnect density due to semiconductor die 230 being mounted in recess 202. Semiconductor die 240 are mounted to back surface 238 of semiconductor die 230 with interposing insulating layer 242. Bumps 248 are electrically connected to conductive layer 216. A discrete passive or active circuit can also be mounted to back surface 238 of semiconductor die 230 and electrically connected to conductive layer 216.

In FIG. 5l, semiconductor die 194, 230, and 240 are singulated with saw blade or laser cutting tool 250 into individual FO-WLCSP 252.

In another embodiment, the singulation of semiconductor die 194 may occur prior to mounting semiconductor die 230 and 240, i.e. the structure shown in FIG. 5i can be singulated. In this case, semiconductor die 230 and 240 are mounted after singulation, similar to FIGS. 5j-5k.

FIG. 6 shows FO-WLCSP 252 after singulation. Semiconductor die 194 is electrically connected to interconnect structure 212, conductive vias 208, interconnect structure 218, and bumps 224. Semiconductor die 230 is mounted within recess 202 between stepped or sloped sides 204 and electrically connected to interconnect structure 212, conductive vias 208, interconnect structure 218, and bumps 224. Semiconductor die 224 is mounted over recess 202 and electrically connected to interconnect structure 212, conductive vias 208, interconnect structure 218, and bumps 224. FO-WLCSP 252 has a higher level of integration and reduced height with semiconductor die 230 mounted within recess 202 and interconnect structure 212 following the contour of the recess. Bumps 248 have smaller diameter and finer pitch with semiconductor die 230 mounted within recess 202, which increases I/O count. The smaller bumps 248 reduce risk of bump collapse.

Figure 7:
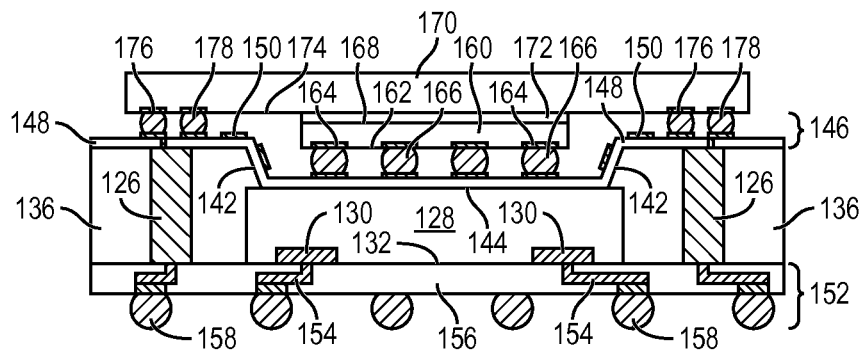
FIG. 7 illustrates the recessed encapsulant extending to the back surface of the bottom semiconductor die.

FIG. 7 shows an embodiment, similar FIG. 4, with recess 140 extending down to back surface 144 of semiconductor die 128. The insulating layer 148 of interconnect structure 146 is formed on encapsulant 136 and back surface 144.

Figure 8:
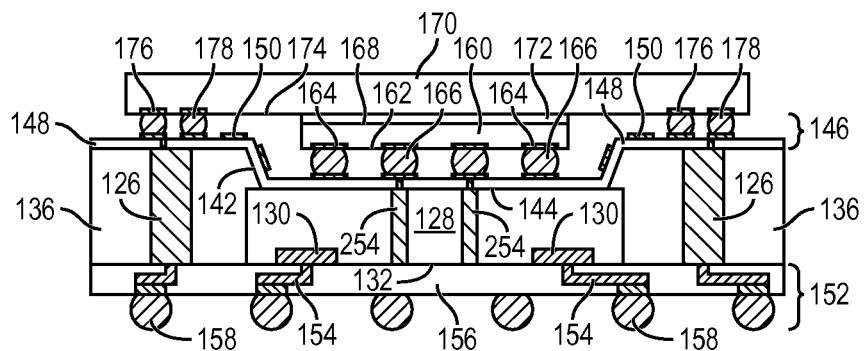
FIG. 8 illustrates TSV formed through the bottom semiconductor die.

FIG. 8 shows an embodiment, similar to FIG. 4, with a plurality of vias is formed through semiconductor die 128 using mechanical drilling, laser drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive through silicon vias (TSV) 254. Semiconductor die 160 and 170 are electrically connected through interconnect structure 146, conductive pillars 126, and TSV 254 to interconnect structure 152. Alternatively, the circuits of semiconductor die 160 are electrically routed through interconnect structure 146 and TSV 254 to interconnect structure 152, and the circuits of semiconductor die 170 are electrically routed through interconnect structure 146 and conductive pillars 126 to interconnect structure 152.

Figure 9:
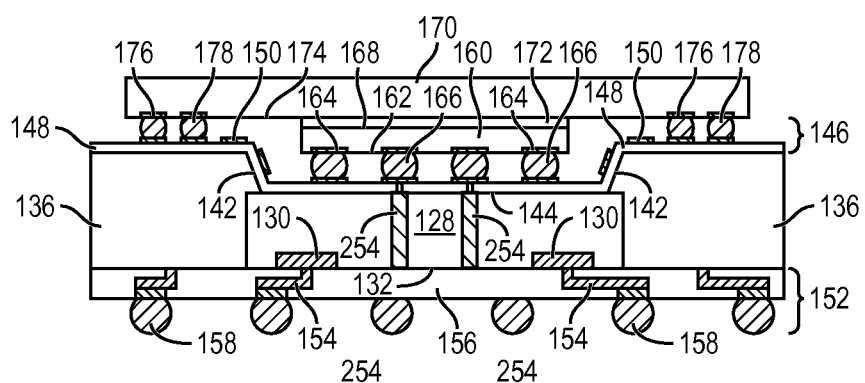
FIG. 9 illustrates TSV formed through the bottom semiconductor die without conductive pillars in the encapsulant.

FIG. 9 shows an embodiment, similar to FIG. 8, without conductive pillars 126. Semiconductor die 160 and 170 are electrically connected through interconnect structure 146 and TSV 254 to interconnect structure 152 and semiconductor die 128.

Figure 10:
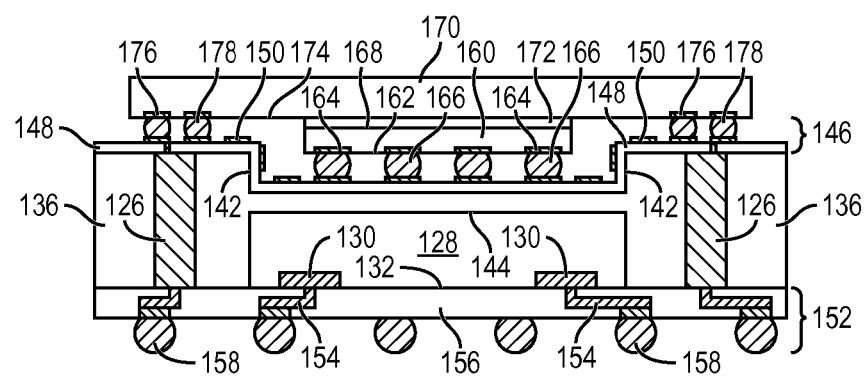
FIG. 10 illustrates a stepped recess formed in the encapsulant.

FIG. 10 shows an embodiment, similar to FIG. 4, with stepped sides 142 within recess 140 for mounting a semiconductor die within the recess.

Figure 11:
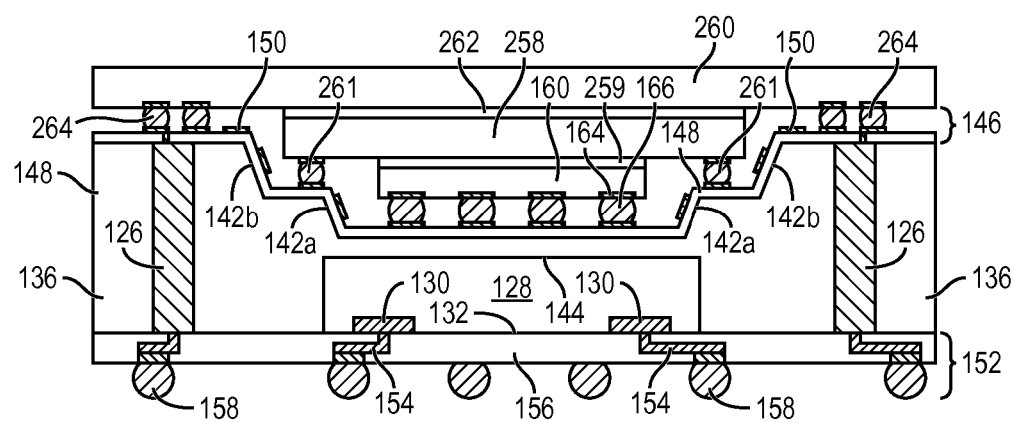
FIG. 11 illustrates a plurality of slopped recesses formed in the encapsulant for mounting multiple semiconductor die.

FIG. 11 shows an embodiment, similar to FIG. 4, with a plurality of stepped or sloped sides 142 within recess 140 for mounting multiple semiconductor die within the recess. Semiconductor die or component 160 is mounted to interconnect structure 146 between sloped sides 142a. Semiconductor die 160 is electrically connected to interconnect structure 146 with bumps 166. Semiconductor die or component 258 is mounted to interconnect structure 146 between sloped sides 142b and over semiconductor die 160 with interposing insulating layer 259. Semiconductor die 258 is electrically connected to interconnect structure 146 with bumps 261. Semiconductor die or component 260 is mounted over recess 140 and over semiconductor die 258 with interposing insulating layer 262. Semiconductor die 260 is electrically connected to interconnect structure 146 with bumps 264. Additional stepped or sloped sides like 142a and 142b can be formed within recess 140 for mounting more stacked semiconductor die.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a first semiconductor die over the substrate;
   disposing a first interconnect structure over the substrate adjacent to the first semiconductor die;
   depositing an encapsulant over the substrate and around the first semiconductor die and first interconnect structure; and
   forming a second interconnect structure to electrically couple the first interconnect structure and the first semiconductor die after depositing the encapsulant.

2. The method of claim 1, further including depositing the encapsulant over the first semiconductor die with the first interconnect structure extending through the encapsulant.

3. The method of claim 1, further including disposing a second semiconductor die over the first semiconductor die with the second semiconductor die electrically connected to the first interconnect structure.

4. The method of claim 1, wherein providing the first semiconductor die includes providing an electrical component and a mechanical component.

5. The method of claim 1, wherein providing the first interconnect structure includes providing a conductive pillar or conductive via.

6. The method of claim 1, further including:
   removing the substrate to expose a first surface of the first semiconductor die; and
   forming the second interconnect structure over the first interconnect structure and first surface of the first semiconductor die.

7. A method of making a semiconductor device, comprising:
   providing a first semiconductor die;
   providing a first interconnect structure; and
   depositing an encapsulant over the first semiconductor die and first interconnect structure with the first interconnect structure extending through the encapsulant and with the first interconnect structure electrically isolated from the first semiconductor die.

8. The method of claim 7, further including forming a first conductive layer over the first interconnect structure.

9. The method of claim 8, further including forming a second conductive layer electrically connected to the first conductive layer through the first interconnect structure.

10. The method of claim 7, further including forming a second interconnect structure over the first semiconductor die, encapsulant, and first interconnect structure.

11. The method of claim 7, further including disposing a second semiconductor die over the first semiconductor die and electrically connected to the first interconnect structure.

12. The method of claim 7, wherein providing the first semiconductor die includes providing an electrical component and a mechanical component.

13. The method of claim 7, wherein providing the first interconnect structure includes providing a conductive pillar or conductive via.

14. A method of making a semiconductor device, comprising:
   providing a substrate;
   disposing a first semiconductor die on the substrate;
   disposing a first interconnect structure on the substrate;
   depositing an encapsulant over the first semiconductor die and first interconnect structure;
   removing the substrate to expose an active surface of the first semiconductor die after depositing the encapsulant; and
   forming a build-up interconnect structure over the active surface of the first semiconductor die, the encapsulant, and the first interconnect structure after removing the substrate.

15. The method of claim 14, further including depositing the encapsulant with the first interconnect structure extending through the encapsulant.

16. The method of claim 14, further including disposing a second semiconductor die over the first semiconductor die with the second semiconductor die electrically connected to the build-up interconnect structure through the first interconnect structure.

17. The method of claim 14, wherein providing the first semiconductor die includes providing an electrical component and a mechanical component.

18. The method of claim 14, wherein providing the first interconnect structure includes providing a conductive pillar or conductive via.

19. The method of claim 14, further including forming a conductive layer over the first interconnect structure opposite the build-up interconnect structure.

20. A method of making a semiconductor device, comprising:
   providing a substrate;
   disposing a first semiconductor die on the substrate;
   disposing a first interconnect structure on the substrate; and
   depositing an encapsulant over the first semiconductor die with the first interconnect structure extending from a top surface of the encapsulant to a bottom surface of the encapsulant.

21. The method of claim 20, further including forming a first conductive layer over the first interconnect structure.

22. The method of claim 21, further including forming a second conductive layer electrically connected to the first conductive layer through the first interconnect structure.

23. The method of claim 20, further including forming a second interconnect structure over the first semiconductor die, encapsulant, and first interconnect structure.

24. The method of claim 20, further including disposing a second semiconductor die over the first semiconductor die and electrically connected to the first interconnect structure.

25. The method of claim 20, wherein providing the first interconnect structure includes providing a conductive pillar or conductive via.

* * * * *